United States Patent
Laugeois

(10) Patent No.: US 10,763,980 B2
(45) Date of Patent: Sep. 1, 2020

(54) METHOD FOR CONTROLLING A GAIN

(71) Applicant: Commissariat à l'Énergie Atomique et aux Énergies Alternatives, Paris (FR)

(72) Inventor: Marc Laugeois, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 16/510,006

(22) Filed: Jul. 12, 2019

(65) Prior Publication Data
US 2020/0021371 A1  Jan. 16, 2020

(30) Foreign Application Priority Data
Jul. 13, 2018 (FR) ..................... 18 56464

(51) Int. Cl.
*H04B 17/21* (2015.01)
*H04B 1/10* (2006.01)
*H04B 1/12* (2006.01)
*H03G 3/30* (2006.01)

(52) U.S. Cl.
CPC ............ *H04B 17/21* (2015.01); *H03G 3/30* (2013.01); *H04B 1/1027* (2013.01); *H04B 1/12* (2013.01); *H03G 2201/103* (2013.01)

(58) Field of Classification Search
CPC ............ H03G 2201/103; H04B 17/21; H04B 1/1027; H04B 1/12
See application file for complete search history.

(56) References Cited

U.S. PATENT DOCUMENTS 8,059,734 B1 * 11/2011 Sun ................. H04B 7/0857 370/241
2010/0067626 A1 * 3/2010 Sankabathula ......... H04L 1/206 375/345
2016/0013816 A1  1/2016 Xia et al.

FOREIGN PATENT DOCUMENTS

EP 2 533 426  12/2012
WO WO 2012/152549  11/2012

OTHER PUBLICATIONS

Preliminary Search Report for French Application No. 1856464, dated Mar. 13, 2019.
Jiménez et al., Design and Implementation Synchronization and AGC for OFDM-based WLAN Receivers, IEEE Transactions on Consumer Electronics. Nov. 4, 2004; 50(4): 1016-25.
Lee et al., Efficient automatic gain control algorithm and architecture for wireless LAN receivers. Journal of Systems Architecture. 2007;53:379-85.

* cited by examiner

*Primary Examiner* — David S Huang
(74) *Attorney, Agent, or Firm* — Wolf, Greenfield & Sacks, P.C.

(57) ABSTRACT

A calibration method for calibrating a reception chain comprising an input amplifier of an analogue-to-digital converter, and including the following successive steps: determining a rest gain as a function of the average power of the noise present on a digital signal from said converter; and setting the gain of the input amplifier at said rest gain when the average power of said digital signal is lower than a first threshold.

13 Claims, 5 Drawing Sheets

METHOD FOR CONTROLLING A GAIN

CROSS REFERENCE TO RELATED APPLICATIONS

This application claims priority to French patent application number 18/56464, filed on Jul. 13, 2018, the contents of which is hereby incorporated by reference in its entirety.

FIELD

The present disclosure relates to processing systems for digitally processing information, and more specifically to their calibration. The present disclosure relates even more specifically to control methods for controlling a gain of a variable-gain amplifier comprised in these systems.

PRESENTATION OF THE PRIOR ART

A processing system, for example for receiving an analogue signal, generally comprises at least an amplifier and an analogue-to-digital converter by means of which it is possible to sample the signal received by the system. The amplifier makes it possible to adapt the amplitude of the received signal to a working range of the analogue-to-digital converter. The amplifier can be a variable-gain amplifier, i.e. an amplifier the gain of which can be modulated, for example as a function of the amplitude of the received signal and/or as a function of the range of linearity of the analogue-to-digital converter.

It would be desirable to improve certain aspects of the methods for calibrating a reception chain, and more specifically, certain aspects of existing methods for determining gains.

SUMMARY

One embodiment provides a calibration method for calibrating a reception chain comprising an input amplifier of an analogue-to-digital converter, and comprising the following successive steps: determining a rest gain as a function of the average power of the noise present on a digital signal from said converter; and setting the gain of the input amplifier at the rest gain when the average power of said digital signal is lower than a first threshold.

According to an embodiment, the gain is adjusted by adding a gain adjustment increment determined as a function of the average power of the digital signal when the average power of the digital signal is greater than a second threshold.

According to an embodiment, in order to calculate the gain adjustment increment, the average power of the digital signal is calculated as a function of the linear power of the digital signal.

According to an embodiment, the linear power Plin is calculated in accordance with the formula:

$$Plin = \frac{I^2 + Q^2}{K}$$

wherein:
I is the imaginary part of the digital signal;
Q is the real part of the digital signal; and
K is a factor conditioning the number of bits on which the linear power Plin is encoded.

According to an embodiment, the number K designates the least significant bits for which the average power of the digital signal is not measurable.

According to an embodiment, the average power is calculated by using an infinite impulse-response filter.

According to an embodiment, the average power is converted into a logarithmic average power.

According to an embodiment, the logarithmic average power P log is obtained from a table the elements of which are calculated in accordance with the formula:

$$P\log = \frac{2^{N'} - 1}{\ln(2^{N'} - 1)} \ln(Pmoy)$$

wherein N' is the number of bits on which the logarithmic average power is encoded; and
Pmoy represents the average power of the digital signal.

According to an embodiment, the gain adjustment increment ginc is calculated in accordance with the formula:

$$ginc = \frac{Pref - P\log}{[1dB]}$$

where Pref is a reference power.

According to an embodiment, the reference power is determined as a function of the maximum power reached by the digital signal.

According to an embodiment, the reception chain transmits data packets.

According to an embodiment, the gain of the amplifier is adjusted after a single iteration.

According to an embodiment, the gain of the amplifier is adjusted after at least one iteration.

According to an embodiment, the number of iterations is equal to one or two.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. For the sake of clarity, only the elements that are useful for an understanding of the described embodiments herein have been illustrated and described in detail. In particular, the operation of an analogue-to-digital converter will not be described in detail; indeed, the described embodiments are compatible with conventional analogue-to-digital converters.

In the following disclosure, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc. Unless specified otherwise, the expressions "around", "approximately", "substantially" and "in the order of" signify within 10%, and preferably within 5%.

Figure 1:
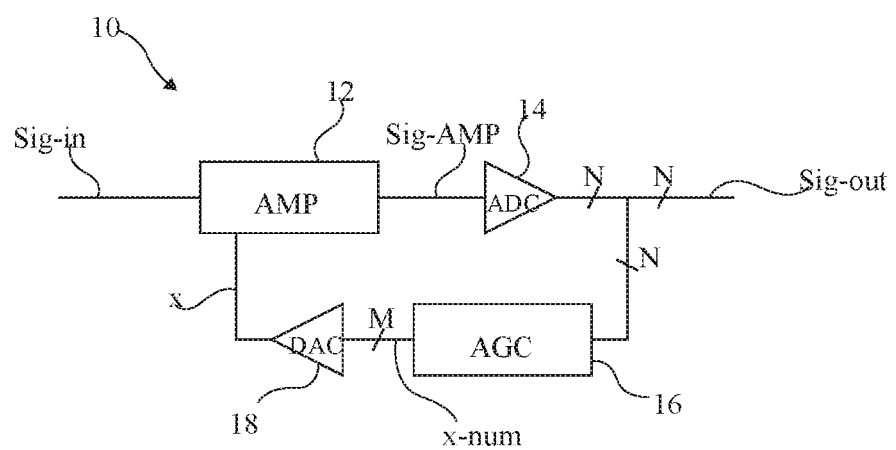
FIG. 1 illustrates, in the form of a block diagram, an embodiment of a part of a reception chain.

FIG. 1 is simplified block diagram depicting an embodiment of a reception chain 10.

The reception chain 10 receives, as an input, an analogue signal Sig-in and provides, as an output, a digital signal Sig-out. The reception chain 10 is designed for the reception of data transmitted in packets.

The analogue signal Sig-in is first processed by an amplifier 12 (AMP). The amplifier 12 is a variable-gain amplifier, i.e. an amplifier the gain of which can be modified by a command, for example an analogue command x. The amplifier 12 amplifies the analogue signal Sig-in and provides an analogue signal Sig-AMP to an analogue-to-digital converter 14 (ADC). More specifically, the amplifier 12 adapts the amplitude of the analogue signal Sig-in so as to make it correspond to a working range of the analogue-to-digital converter 14. The analogue-to-digital converter 14 provides, as an output, the digital signal Sig-out encoded on a number N of bits.

The reception chain 10 further comprises a circuit 16 that executes a gain control algorithm AGC. The algorithm AGC receives, as an input, the digital signal Sig-out and provides, as an output, a digital command x-num encoded on a number M of bits. By means of the algorithm AGC, it is possible to determine, from the digital signal Sig-out, the digital command x-num. The digital command x-num is converted into the analogue command x by a digital-to-analogue converter 18 (DAC) adapted to convert a digital signal encoded on a number M of bits into an analogue signal. The analogue command x is then transmitted to the amplifier 12 in order to control its gain. The numbers N and M can be different or equal.

Figure 2:
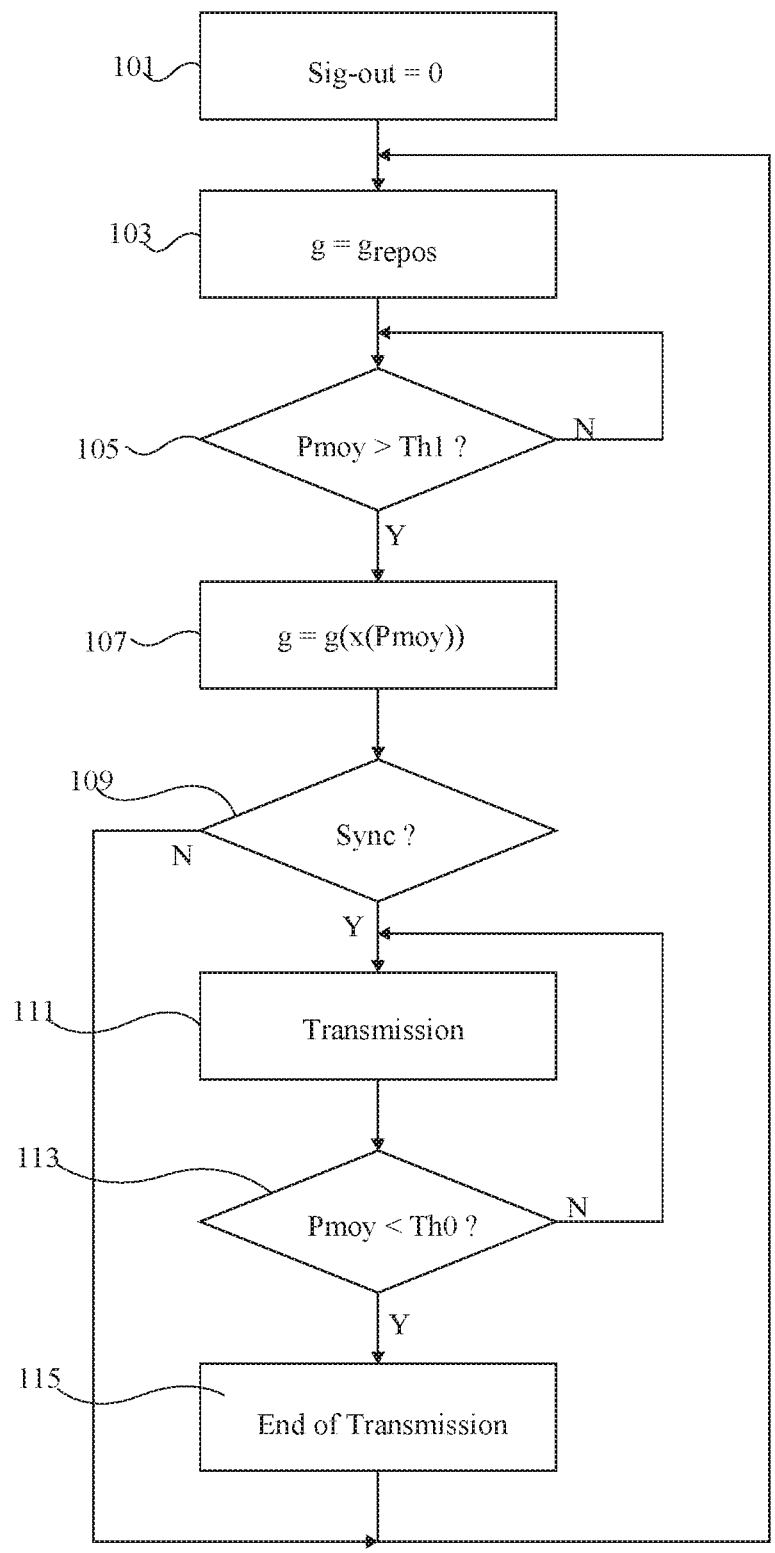
FIG. 2 illustrates, in the form of a state diagram, an embodiment of a calibration method for calibrating the reception chain of FIG. 1.

FIG. 2 is a block diagram depicting the operation of an embodiment of the gain control algorithm AGC.

Figure 3:
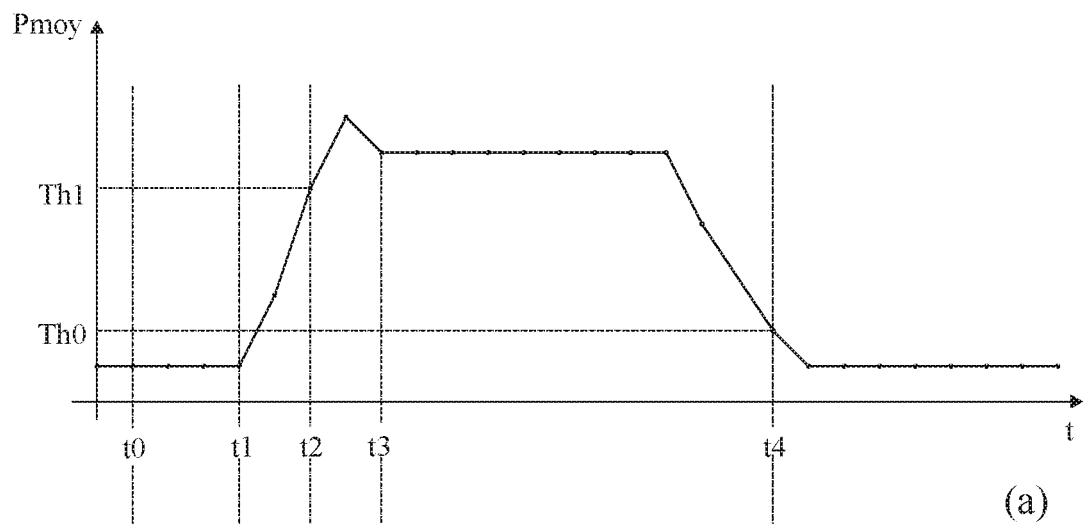
FIG. 3 illustrates two time charts (a) and (b) depicting, respectively, the average power of a signal and the gain of a variable-gain amplifier.
Figure 3:
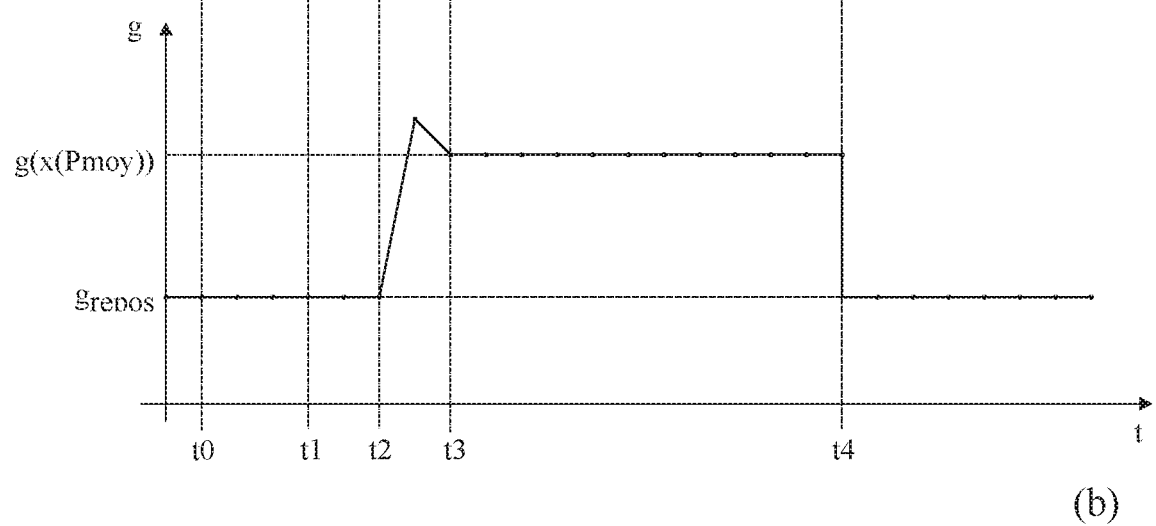

FIG. 3 illustrates two time charts (a) and (b) depicting examples of profiles, respectively, of the average power Pmoy of the digital signal Sig-out and of the gain g of the amplifier 12.

At a state of rest (FIG. 2, block 101, Sig-out=0), between a time t0 and a time t1 (FIG. 3), the chain does not receive any packet of data. This state of rest can, for example, take place before the transmission of a packet, or between two transmissions of a packet. The digital signal Sig-out is considered low; more specifically, its average power Pmoy is less than a threshold Th0. The threshold Th0 corresponds to an end-of-frame threshold or to a no-signal threshold. The threshold Th0 is defined at conception-manufacture. The threshold Th0 is, for example, set at 0 Watt.

At the state of rest, the algorithm AGC provides a digital command x-num(grepos) which, once converted into an analogue command x(grepos) by the digital-to-analogue converter 18, sets the gain g (FIG. 3, time chart (b)) of the amplifier 12 to a rest value grepos (FIG. 2, block 103, g=grepos). This rest value grepos, or rest gain, is defined, at conception-manufacture, outside a saturation zone of the analogue-to-digital converter 14. More specifically, the rest gain grepos is determined from the average power of the signal Sig-out when it does not transmit a packet, i.e. when the average power of the signal Sig-out only corresponds to an average power of the noise present on the signal Sig-out. As a variant, the algorithm AGC can comprise a step by means of which it is possible to adjust the rest gain grepos in a more precise manner in a process of adaptation to a plurality of packet transmissions.

The circuit 12 thus compares (FIG. 2, block 105, Pmoy>Th1?) the average power Pmoy of the signal Sig-out with a threshold value Th1 in order to detect a packet beginning. The threshold Th1 corresponds to a start-of-frame threshold. The threshold Th1 is greater than the threshold Th0. For instance, the threshold Th1 can be defined as being equal to half the signal-to-noise ratio (SNR) of the digital signal Sig-out during the initialisation of the chain 10. According to a further example, the threshold Th1 can be less than half the signal-to-noise ratio of the digital signal Sig-out so as to detect the data packet as early as possible.

As long as the average power of the signal Sig-out is lower than the value Th1 (FIG. 2, output N of the block 105), i.e. up to a time t2 later than the time t1 (FIG. 3), the gain of the amplifier 12 remains set at the rest value grepos in light of what is considered to be an absence of a packet.

When the average power Pmoy of the digital signal Sig-out exceeds the threshold value Th1 (FIG. 2, output Y of the block 105) (FIG. 3, time t2), the algorithm thus moves to a step of determining the gain command (FIG. 2, block 107, g=g(x(Pmoy))). More specifically, the algorithm AGC determines a new digital command x-num(Pmoy) which, once converted into an analogue command x(Pmoy) by the converter 18, sets the gain of the amplifier 12 to a gain value g(x(Pmoy)). This gain value g(x(Pmoy)) is determined as a function of the average power Pmoy of the digital signal Sig-out. A more detailed example of a method for determining the gain value g(x(Pmoy)) will be described in relation to FIG. 4.

Once the gain of the amplifier 12 has been set, the algorithm moves to a delayed step of waiting for the synchronisation of the digital signal Sig-out (FIG. 2, block 109, Sync?) between the time t2 and a time t3 (FIG. 3).

If at the end of the response window the synchronisation is unsuccessful (FIG. 2, output N of the block 109), the circuit considers that the transmission of a packet has not taken place and returns to the state of rest (FIG. 2, block 103). This case is not depicted in FIG. 3.

If the synchronisation is successful (FIG. 2, output Y of the block 109) the transmission of the packet begins (FIG. 2, block 111, Transmission) at the time t3 (FIG. 3).

The power of the signal Sig-out is thus compared with the threshold Th0 (FIG. 2, block 105, Pmoy<Th0?).

As long as the average power of the signal Sig-out is greater than the threshold value Th0 (FIG. 2, output N of the block 105) (illustrated in FIG. 3 between the times t2 and t4) the gain of the amplifier 12 remains set at the gain value g(x(Pmoy)) depending on the average power of the signal as the transmission of the packet has not ended.

When the average power Pmoy of the digital signal Sig-out decreases until it becomes lower than the threshold Th0 (FIG. 2, output Y of the block 113) (FIG. 3, time t4), the transmission of the packet ends (FIG. 2, block 115, End of transmission).

The algorithm thus returns to the situation of the block 103.

An advantage of the gain control algorithm AGC described in relation to FIGS. 2 and 3 is that the amplitude of the analogue signal Sig-AMP, provided to the analogue-to-digital converter 14, is never in a saturation zone of the converter 14.

A further advantage of this algorithm is that it makes possible a rapid adjustment of the gain of the amplifier at the moment the packet is detected on the receiver, and this without knowing the time of arrival of the packet.

Figure 4:
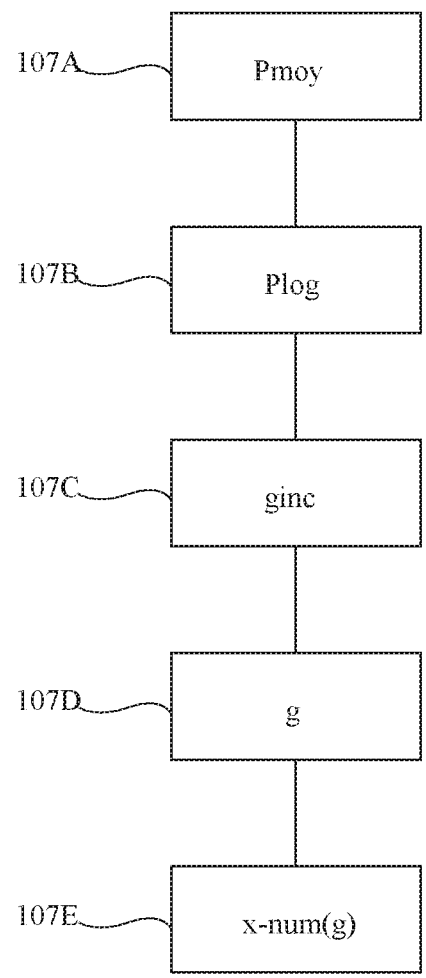
FIG. 4 illustrates, in the form of a block diagram, an embodiment of a method for determining a gain adjustment increment.

FIG. 4 is a block diagram depicting in greater detail computations carried out during the step 107 for determining the gain command.

At a 107A (Pmoy), the average power Pmoy of the digital signal Sig-out is calculated. For this purpose, the linear power Plin of the digital signal Sig-out is measured then averaged using, for example a first-order infinite impulse-response filter.

For instance, the linear power Plin of the digital signal Sig-out is measured by applying the following formula:

$$Plin = \frac{I^2 + Q^2}{K}$$

wherein:
I is the imaginary part of the digital signal Sig-out;
Q is the real part of the digital signal Sig-out; and
K is a factor conditioning the number of bits on which the linear power is encoded, this factor being described in greater detail in relation to FIG. 5.

At a step 107B (P log), the average power Pmoy determined at the step 107A is converted into a logarithmic average power P log. For instance, the logarithmic average power P log is obtained by a logarithmic table the elements of which are calculated by the following formula:

$$P\log = \frac{2^{N'} - 1}{\ln(2^{N'} - 1)} \ln(Pmoy)$$

wherein N' is the number of bits on which the logarithmic power P log is encoded.

The logarithmic table is, for example, stored in a memory belonging to the circuit 16.

At a step 107C (ginc), a gain adjustment increment ginc is determined from the logarithmic average power P log determined at step 107B. For instance, the increment ginc in dB is calculated by the following formula:

$$ginc = Pref - P\log$$

wherein Pref is a logarithmic reference power defined by the user.

As a variant, the logarithmic reference power Pref can be defined as a function of the maximum power reached by the digital signal Sig-out.

At a step 107D (g), the value of the gain g, or g(x(Pmoy)), by means of which it is possible to adjust the amplifier 12, is determined as a function of the gain adjustment increment determined at step 107C. For this purpose, the value of the gain adjustment increment is added to the value of the already programmed gain of the amplifier 12. More specifically, during the state of rest of block 101, the amplifier is programmed with a gain equal to the rest gain grepos, and at the following instant, the gain of the amplifier 12 is equal to the sum of the rest gain and the gain adjustment increment ginc. During the step 107, the gain g can be determined following a plurality of iterations, for example one to ten iterations, preferably one or two iterations. In other words, the adapted gain g(n+1) by the order of n+1 is equal to:

$$g(n+1) = g(n) + ginc$$

wherein g(n) represents the current gain of the order n.

An advantage of using a plurality of iterations for determining the gain g is that, by this means, it is possible to obtain a finer adjustment of the gain g. In addition, in cases where the signal-to-noise ratio is lower than approximately 36 dB, a single iteration is necessary.

At a step 107E (x-num(g)), the digital command x-num (g), sent by the gain control algorithm AGC to the digital-to-analogue converter 18, is determined as a function of the gain value g determined at step 107D. For this purpose, for example, the following formula is used:

$$x - num(g) = \frac{2^M - 1}{g_{min} - g_{max}} \cdot \frac{V_{max} - V_{min}}{V_{max}} \cdot \left(g - \frac{g_{min} \cdot V_{max} - g_{max} \cdot V_{min}}{V_{max} - V_{min}}\right)$$

wherein:
M is the number of bits on which the digital-to-analogue converter encodes the digital command x-num(g);
gmin is the minimum gain that the amplifier 12 can provide;
gmax is the maximum gain that the amplifier 12 can provide;
Vmin is the minimum voltage that the amplifier 12 can provide; and
Vmax is the maximum voltage that the amplifier 12 can provide.

Figure 5:
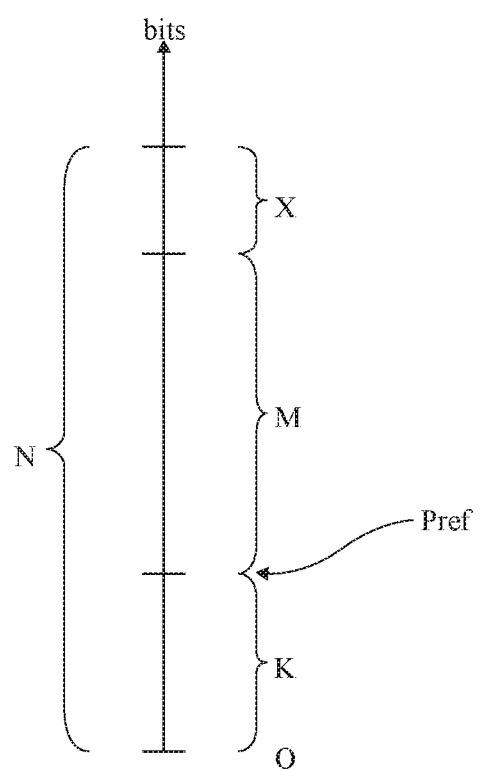
FIG. 5 depicts an example implementation of a step of the method of FIG. 4.

FIG. 5 depicts schematically the determination of the factor K used for the calculation of the linear power Plin defined in relation to FIG. 4.

FIG. 5 illustrates a scale outlining the case where the converters 14 and 18, respectively, encode and decode signals with different numbers of bits N and M and, more specifically, the case where the number of bits M is less than the number of bits N. Thus, the signal Sig-out is encoded on N bits by the analogue-to-digital converter and its average power Pmoy is encoded on M bits. In order to lower the number of bits N on which the signal Sig-out is encoded, the N bits of the signal Sig-out are truncated by K least significant and by X most significant bits that are not used.

The number X is determined empirically as a function of the form of the signal Sig-out. For instance, when the signal Sig-out is a signal of the Gaussian type, the value of X is 3. For instance, when the signal Sig-out is a signal of the square wave type, the value of X is 1. For instance, the number X is equal to 2.

The number K groups together all signal values Sig-out that are too low to be considered useful. Thus, the linear powers Plin that are too low to be measured are eliminated. For instance, the number K is defined by the following formula:

$$K = 2^{2N-M-1-X} - 1$$

Particular embodiments have been described. Various variants and modifications capable of being combined will occur to those skilled in the art. In particular, the gain control algorithm AGC could comprise a method for the self-calibration of the rest gain grepos.

Moreover, the practical implementation of the embodiments that have been described is within the reach of those skilled in the art based on the functional description given hereinabove.

The invention claimed is:

1. A calibration method for calibrating a reception chain comprising an input amplifier of an analogue-to-digital converter, and comprising the following successive steps:
   determining a rest gain as a function of the average power of the noise present on a digital signal from said converter; and
   setting the gain of the input amplifier at said rest gain when the average power of said digital signal is lower than a first threshold,
   wherein the gain is adjusted by adding a gain adjustment increment determined as a function of the average power of the digital signal when the average power of the digital signal is greater than a second threshold.

2. The method according to claim 1, wherein, in order to calculate the gain adjustment increment, the average power of the digital signal is calculated as a function of a linear power of the digital signal.

3. The method according to claim 2, wherein the linear power Plin is calculated in accordance with the formula:

$$Plin = \frac{I^2 + Q^2}{K}$$

wherein:
I is the imaginary part of the digital signal;
Q is the real part of the digital signal; and
K is a factor conditioning the number of bits on which the linear power Plin is encoded.

4. The method according to claim 3, wherein the number K designates the least significant bits for which the average power of the digital signal is not measurable.

5. The method according to claim 1, wherein the average power is calculated using an infinite impulse-response filter.

6. The method according to claim 1, wherein the average power is converted into a logarithmic average power P log.

7. The method according to claim 6, wherein the logarithmic average power P log is obtained from a table the elements of which are calculated in accordance with the formula:

$$P\log = \frac{2^{N'} - 1}{\ln(2^{N'} - 1)} \ln(Pmoy)$$

wherein N' is the number of bits on which the logarithmic average power is encoded; and
Pmoy represents the average power of the digital signal.

8. The method according to claim 6, wherein the gain adjustment increment ginc is calculated in accordance with the formula:

$$ginc = \frac{Pref - P\log}{[1dB]}$$

where Pref is a reference power.

9. The method according to claim 8, wherein the reference power is determined as a function of the maximum power reached by the digital signal.

10. The method according to claim 1, wherein the reception chain receives data transmitted in packets.

11. The method according to claim 1, wherein the gain of the amplifier is adjusted after a single iteration.

12. The method according to claim 1, wherein the gain of the amplifier is adjusted after at least one iteration.

13. The method according to claim 12, wherein the number of iterations is equal to one or two.

* * * * *